United States Patent
Lee et al.

(10) Patent No.: US 8,824,229 B2
(45) Date of Patent: Sep. 2, 2014

(54) SEMICONDUCTOR MEMORY APPARATUS HAVING A PRE-DISCHARGING FUNCTION, SEMICONDUCTOR INTEGRATED CIRCUIT HAVING THE SAME, AND METHOD FOR DRIVING THE SAME

(75) Inventors: Hyun Joo Lee, Icheon-si (KR); Hyuck Soo Yoon, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 346 days.

(21) Appl. No.: 13/219,627

(22) Filed: Aug. 27, 2011

(65) Prior Publication Data

US 2012/0155204 A1 Jun. 21, 2012

(30) Foreign Application Priority Data

Dec. 21, 2010 (KR) ........................ 10-2010-0131287

(51) Int. Cl.
G11C 7/00 (2006.01)
G11C 13/00 (2006.01)
G11C 7/12 (2006.01)

(52) U.S. Cl.
CPC .............. *G11C 7/12* (2013.01); *G11C 13/0004* (2013.01); *G11C 13/0069* (2013.01); *G11C 13/0026* (2013.01); *G11C 13/004* (2013.01)

USPC ............. 365/203; 365/51; 365/148; 365/158; 365/163; 365/171; 365/173

(58) Field of Classification Search
USPC ............ 365/51, 148, 158, 163, 171, 173, 203
See application file for complete search history.

(56) References Cited

U.S. PATENT DOCUMENTS

| 8,445,880 B2 * | 5/2013 | Park .................................. 257/2 |
| 2008/0189518 A1 * | 8/2008 | Sutardja et al. ................ 712/207 |
| 2009/0129144 A1 * | 5/2009 | Kim et al. ..................... 365/163 |
| 2009/0285009 A1 * | 11/2009 | Kim et al. ..................... 365/148 |

FOREIGN PATENT DOCUMENTS

| KR | 1020060115129 A | 11/2006 |
| KR | 1020080027921 A | 3/2008 |
| KR | 1020090052016 A | 5/2009 |
| KR | 1020100046435 A | 5/2010 |

* cited by examiner

*Primary Examiner* — Tha-O H Bui
(74) *Attorney, Agent, or Firm* — William Park & Associates Ltd.

(57) ABSTRACT

A semiconductor memory apparatus includes a bit line coupled to a plurality of memory cells, a discharge controller configured to generate a bit line discharge signal to pre-discharge the bit line before the memory cells are activated, and a bit line discharge block coupled to the bit line and configured to discharge the bit line in response to the bit line discharge signal.

9 Claims, 2 Drawing Sheets

SEMICONDUCTOR MEMORY APPARATUS HAVING A PRE-DISCHARGING FUNCTION, SEMICONDUCTOR INTEGRATED CIRCUIT HAVING THE SAME, AND METHOD FOR DRIVING THE SAME

CROSS-REFERENCES TO RELATED APPLICATION

The present application claims priority under 35 U.S.C. §119(a) to Korean application number 10-2010-0131287, filed on Dec. 21, 2010, in the Korean Intellectual Property Office, which is incorporated herein by reference in its entirety as set forth in full.

BACKGROUND

1. Technical Field

The present invention relates generally to a semiconductor is integrated circuit and a method for driving the same, and more particularly, to a semiconductor memory apparatus having a pre-discharging function, a semiconductor integrated circuit having the same, and a method for driving the same.

2. Related Art

A semiconductor memory apparatus is divided into a volatile memory apparatus which requires constant electronic recharging to preserve its data, and a nonvolatile memory apparatus which retains its data even in absence of power supply. The volatile memory apparatus includes DRAM and SRAM, and the nonvolatile memory apparatus includes flash memory.

DRAM has an advantage in that it has low power consumption and allows a random access. However, since DRAM is a volatile memory, a high charge storage capability may be required. SRAM used as cache memory has an advantage in that it allows a random access and has a high operation speed. However, since SRAM is not only a volatile memory but also has a large size, the cost thereof is high. Furthermore, the flash memory is a nonvolatile memory, but requires a higher operation voltage than an external power supply voltage. Accordingly, a voltage boosting circuit is required to form the operation voltage required for a write/erase operation.

Meanwhile, ferroelectric random access memory (FRAM), magnetic random access memory (MRAM), and phase-change random access memory (PRAM) are being developed as the next is generation of semiconductor memory device.

Among them, PRAM includes a phase-change material having high resistance in an amorphous state and low resistance in a crystalline state, and writes information into the memory device by a phase change of the phase-change material. PRAM has a higher operation speed and a degree of higher integration than the flash memory.

A memory cell of such a phase-change memory apparatus may include a switching element coupled to a word line, a variable resistor formed of a phase-change material which receives current through the switching element, and a bit line coupled to the variable resistor.

Here, a write operation of the phase-change apparatus provides a certain current, for example, from the bit line to a phase-change material of a selected memory cell to change the phase of the phase-change material into a crystalline state or amorphous state, and thus data of 0 (set) or 1 (reset) is written to the phase-change material.

Meanwhile, a read operation of the phase-change memory apparatus is performed by measuring resistance of the phase-change material to which the data of 0 or 1 has been written by the write operation.

Such a phase-change memory apparatus includes a bit line discharge block having a plurality of bit line discharge switches coupled to one ends of the respective bit lines, in order to precisely read and write data. Each of the bit line discharge switches is configured to discharge electric charges stored in the corresponding bit line at the initial stage of an active mode, in response to an active mode signal.

Accordingly, the phase-change memory apparatus needs to discharge the bit lines by sufficiently performing a discharge operation, for example, before a read or write operation. However, due to a time taken to perform the discharge operation, an actual time for performing the read/write operation may decrease to meet a required operation time in a standard. Therefore, a read/write failure of the phase-change memory apparatus may occur.

SUMMARY

In an embodiment of the present invention, a semiconductor memory apparatus includes: a bit line coupled to a plurality of memory cells; a bit line discharge block electrically coupled to the bit line and configured to discharge the bit line in response to a bit line discharge signal; and a discharge controller configured to generate the bit line discharge signal and control the bit line discharge block to pre-discharge the bit line before the memory cells are actively driven.

In an embodiment of the present invention, a semiconductor memory apparatus includes: a cell array region including a plurality of word lines, a plurality of bit lines arranged to cross the respective word lines, and a plurality of memory cells positioned adjacent to the respective intersections between the word lines and the bit lines and is configured to selectively electrically conduct the word lines and the bit lines; a bit line discharge block including a plurality of dummy cells coupled to the respective bit lines and configured to discharge the bit lines in response to a bit line discharge signal; and a discharge controller configured to provide the bit line discharge signal and provide an additional enabled bit line discharge signal to pre-discharge the bit lines by a predetermined amount, before an enabled active mode signal is applied to the cell array region.

In an embodiment of the present invention, a semiconductor integrated circuit includes: a signal transmission line; a discharge block coupled to the signal transmission line and configured to discharge data of the signal transmission line in response to a discharge signal; and a control block electrically coupled to the discharge block and configured to provide the discharge signal which is enabled at regular discharge timing and pre-discharge timing before the regular discharge timing, respectively.

In an embodiment of the present invention, a method for driving a semiconductor memory apparatus includes the steps of: pre-discharging a bit line by a first time according to an arbitrary signal having an enable section corresponding to the first time, before an active mode signal is enabled; and regularly discharging the bit line by a second time in response to the active mode signal, after the active mode signal is enabled.

BRIEF DESCRIPTION OF THE DRAWINGS

Features, aspects, and embodiments are described in conjunction with the attached drawings, in which.

DETAILED DESCRIPTION

Hereinafter, a semiconductor memory apparatus having a pre-discharging function, a semiconductor integrated circuit having the same, and a method for driving the same according to the present invention will be described below with reference to the accompanying drawings through exemplary embodiments.

Figure 1:
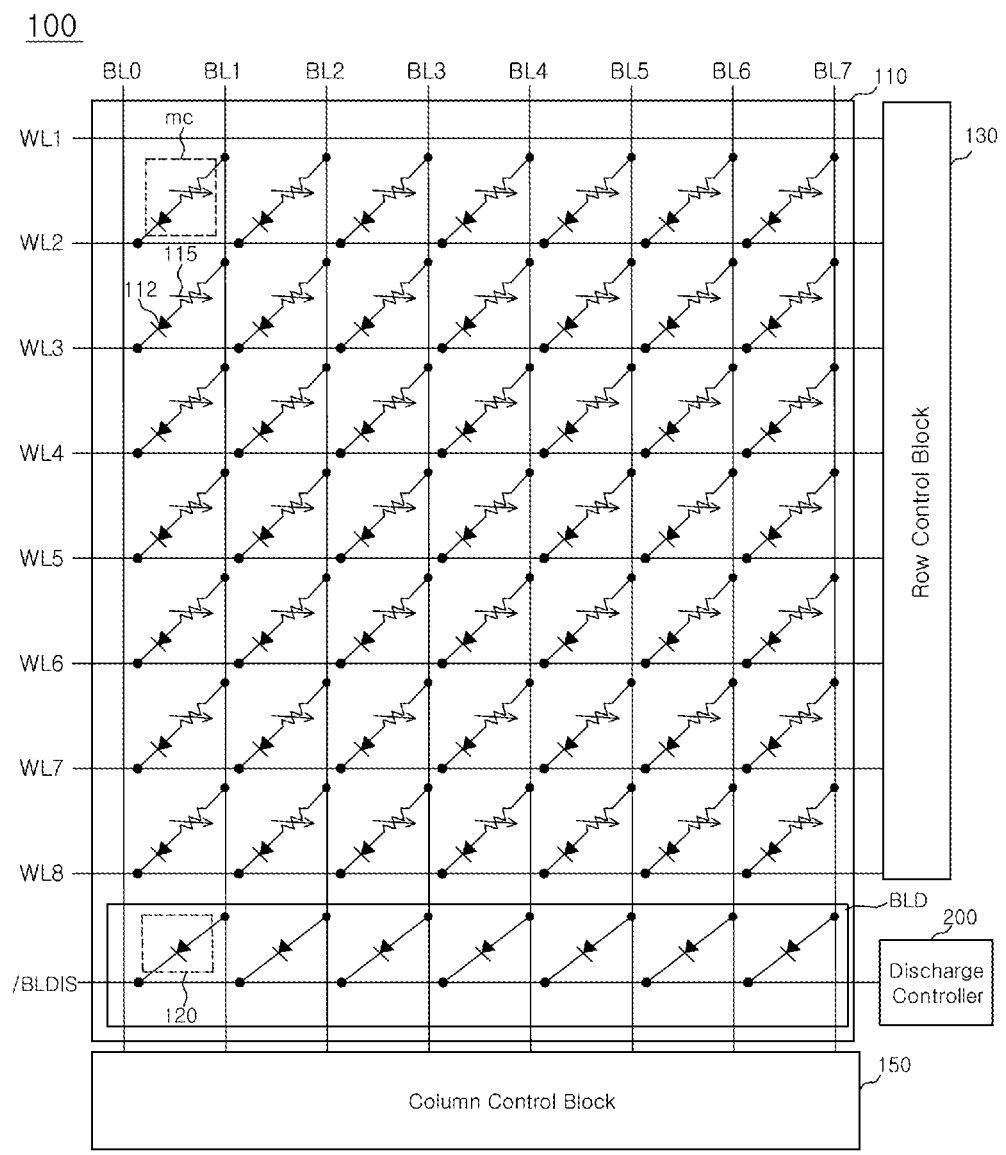
FIG. 1 is a schematic circuit diagram of a semiconductor integrated circuit according to an embodiment.

FIG. 1 is a schematic circuit diagram of a semiconductor integrated circuit according to an embodiment, for example, a semiconductor memory apparatus including resistor elements.

Referring to FIG. 1, the semiconductor memory apparatus 100 includes a cell array 110 having a plurality of unit memory cells mc, a bit line discharge block BLD, and a discharge controller 200.

The respective memory cells mc composing the cell array 110 are defined by a plurality of word lines WL1 to WL8 and a plurality of bit lines BL0 to BL7, which are arranged to cross each other, and are positioned adjacent to the respective intersections between the word lines WL1 to WL8 and the bit lines BL0 to BL7. The unit memory cells mc may include switching elements coupled to the word lines WL1 to WL8, for example, switching diodes 112, and variable resistors 115 coupled to the bit lines BL0 to BL7. The resistance values of the variable resistors 115 vary by switching the phase of the variable resistor 115 between a crystalline and amorphous state based on the application of heat by an electrical current which flows though the switching diodes 112. Here, MOS transistors and bipolar transistors capable of performing a switching function may be used instead of the switching diodes 112. However, the area of the diodes having a vertical structure may be smaller than other switching elements. Furthermore, the variable resistors 115 may be formed of a phase-change material. In an embodiment, the phase-change memory apparatus will be described as an example of the semiconductor memory apparatus.

The plurality of word lines WL1 to WL8 are controlled by a row control block 130, and the plurality of bit lines BL0 to BL7 are controlled by a column control block 150. The row control block 130 may include a plurality of word line decoders (not illustrated) configured to select the word lines. The row control block 130 may be positioned in an side of a cell array.

The column control block 150 may be positioned in an side of the cell array, and may include a Y switching unit, a sense amplifier, and a write driver, which are not illustrated in the drawing. The Y switching unit is configured to selectively couple the plurality of bit lines BL0 to BL7 to a global bit line (not shown).

The bit line discharge block BLD is a block for discharging electric charges stored in the bit lines BL0 to BL7 before a read/write operation of the semiconductor memory apparatus, and may be positioned at an end of the bit lines BL0 to BL7, for example, between the column control block 150 and the cell array 110. The bit line discharge block BLD may be arranged adjacent to the column control block 150 to facilitate an access of a control signal provided by the column control block 150 while reducing signal delay.

The bit line discharge block BLD may include a plurality of dummy cells 120 formed in correspondence to the respective bit lines BL0 to BL7. The dummy cells 120 may include dummy diodes 120 and dummy variable resistors (not illustrated). Also, the dummy cells 120 may include only dummy diodes 120. The dummy diodes 120 are coupled between the bit lines BL0 to BL7 and a bit line discharge bar line /BLDIS which receives a bit line discharge signal BLDIS. The bit line discharge block BLD may be formed when the memory cells mc are formed.

The discharge controller 200 according to an embodiment is configured to drive the bit line discharge block BLD before an active signal ACT is enabled. This operation may be called a pre-discharge operation. Accordingly, a regular bit line discharge operation is performed by the application of the active signal ACT, in a state in which some charges were discharged by previously performed the pre-discharge operation by the bit line discharge block BLD. Since is discharging was performed to some extent by the pre-discharging operation, the bit line discharging operation may be performed within a shorter time.

The discharge controller 200 is configured to drive the bit line discharge block, when the active signal ACT is disabled and a first signal SIGNAL_A is enabled and when the active signal ACT is enabled and a bit line discharge enable signal BLDIS_E is enabled. Here, the first signal SIGNAL_A may include one of various signals used in the phase-change memory apparatus, and is enabled when a bit line is to be pre-discharged.

Figure 2:
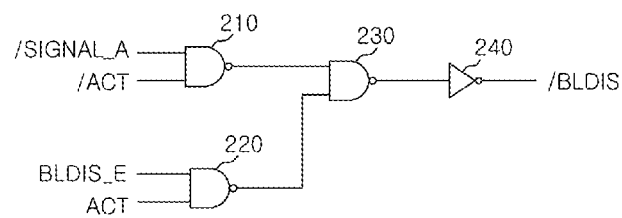
FIG. 2 is a detailed circuit diagram of a discharge controller according to an embodiment.

Referring to FIG. 2, the discharge controller 200 includes a first logic operation unit 210, a second logic operation unit 220, a third logic operation unit 230, and an inversion unit 240. The first logic operation unit 210 is configured to receive the first signal SIGNAL_A and an inverted active signal. The second logic operation unit 220 is configured to receive the bit line discharge enable signal BLDIS_E and the active signal ACT. The third logic operation unit 230 is configured to receive outputs of the first and second logic operation units 210 and 220. The inversion unit 240 is configured to invert an output of the third logic operation unit 230. Here, the first to third logic operation units 210 to 230 may include NAND gates configured to output a low level signal only when the input levels of input signals correspond to a high level. According to an embodiment, a bit line discharge signal used in a known semiconductor memory apparatus may be used as the bit line discharge enable signal BLDIS_E.

Figure 3:
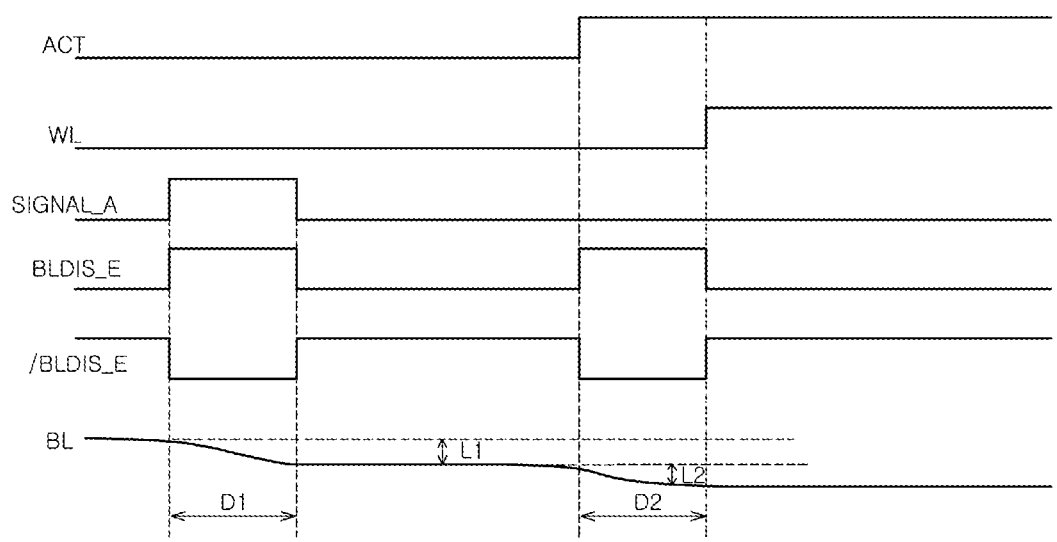
FIG. 3 is a timing diagram explaining the configuration of the semiconductor integrated circuit according to an embodiment.

A method for driving the semiconductor memory apparatus including the bit line discharge controller 200 will be described with reference to FIG. 3.

First, when the active signal ACT is disabled, and the bit line discharge enable signal BLDIS_E and the first signal SIGNAL_A are also disabled to a low level, the first and second logic operation units 210 and 220 output a high level signal, and the inversion unit 240 outputs a bit line discharge bar signal /BLDIS disabled to a high level. For reference, the semiconductor memory apparatus according to an embodiment is designed in such a manner that, when the bit line discharge signal is inputted at a high level, the bit line discharge block BLD is not driven.

Meanwhile, when the active signal ACT and the bit line discharge enable signal BLDIS_E are disabled to a low level, and the first signal SIGNAL_A is enabled during a predetermined period D1 (hereinafter, referred to as a pre-discharge period), the first logic operation unit 210 outputs a low level signal, the second logic operation unit 220 outputs a high level signal, the third logic operation unit 230 outputs a high level signal, and the inversion unit 240 generate a bit line discharge bar signal /BLDIS enabled to a low level (period D1 of FIG. 3).

When the active signal ACT and the bit line discharge enable signal BLDIS_E are enabled to a high level, and the first signal SIGNAL_A is disabled to a low level, that is, during a regular bit line discharge period D2, the first logic operation unit 210 outputs a high level signal, the second logic operation unit 220 outputs a low level signal, and the inversion unit 240 outputs a bit line discharge bar signal /BLDIS enabled to a low level.

Next, when the active signal ACT maintains a high level, the bit line discharge enable signal BLDIS_E is disabled to a low level, and the first signal SIGNAL_A maintains a low level, that is, during an active period after the regular bit line discharge period (read/write period), the first and second logic operation units 210 and 220 output a high level signal, and the inversion unit 240 outputs a bit line discharge bar signal /BLDIS disabled to a high level.

As such, the bit line BL may be pre-discharged by a first level L1 through the bit line pre-discharge operation, before the active signal ACT is enabled. Then, the bit line BL may be discharged by a second level L2 during the regular bit line discharge period. Therefore, although the bit line discharge time decrease, the bit line discharge operation may be performed without a discharge error.

According to an embodiment of the present invention, when electric charges of a specific line are to be discharged before data of the corresponding line are read/written, the pre-discharge driving operation is performed before the regular discharge driving operation. Then, during the regular discharge driving operation, an amount to be discharged may become smaller, and the discharge time may decrease. Accordingly, a sufficient active time may be secured. Furthermore, a probability of a read/write failure caused by a is discharge error may decrease.

The present invention is not limited to the above-described embodiment.

In an embodiment, the phase-change memory apparatus including variable resistors has been described as an example. Without being limited thereto, however, the embodiment of the present invention may be applied to all semiconductor integrated circuits requiring an operation of discharging a signal transmission line.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
   a bit line coupled to a plurality of memory cells;
   a discharge controller configured to generate a bit line discharge signal to pre-discharge the bit line before the memory cells are activated; and
   a bit line discharge block coupled to the bit line and configured to discharge the bit line when the bit line discharge signal is enabled,
   wherein the discharge controller enables the bit line discharge signal in response to a bit line discharge enable signal when an active mode signal is enabled, and enables the bit line discharge signal in response to a first signal when the active mode signal is disabled,
   wherein the discharge controller comprises:
      a first logic circuit unit configured to receive an active mode signal and a bit line discharge enable signal, and output a low level signal when each of the active mode signal and the bit line discharge enable signal is at a high level;
      a second logic circuit unit configured to receive an active mode bar signal and a first signal, and output a low level signal when each of the active mode bar signal and the first signal is at a high level; and
      a third logic circuit unit configured to receive output signals of the first and second logic circuit units.

2. The semiconductor memory apparatus according to claim 1, wherein the discharge controller is configured to receive the active mode signal, the bit line discharge enable signal, and the first signal, and drive the bit line discharge block, when the first signal is enabled even though the active mode signal is disabled.

3. The semiconductor memory apparatus according to claim 2, wherein the discharge controller is configured to enable the active mode signal and the bit line discharge enable signal at the same time.

4. The semiconductor memory apparatus according to claim 2, wherein a pre-discharge period of the bit line is decided by an enable period of the first signal.

5. The semiconductor memory apparatus according to claim 1, wherein the bit line discharge block comprises a dummy switching element electrically coupled to the bit line and a bit line discharge signal line.

6. A semiconductor memory apparatus comprising:
   a cell array region comprising a plurality of word lines, a plurality of bit lines arranged to cross the respective word lines, and a plurality of memory cells selectively coupled to the word lines and the bit lines;
   a bit line discharge block comprising a plurality of dummy cells coupled to the respective bit lines and configured to discharge the bit lines in response to a bit line discharge signal; and
   a discharge controller configured to provide enabled the bit line discharge signal when an active mode signal is enabled and provide an additional enabled bit line discharge signal to pre-discharge the bit lines by a predetermined amount, before an enabled active mode signal is applied to the cell array region,
   wherein the discharge controller is configured to receive the active mode signal, a bit line discharge enable signal, and a first signal, and drive the bit line discharge block, when the first signal is enabled even though the active mode signal is disabled,
   wherein the discharge controller is configured to enable the active mode signal and the bit line discharge enable signal at the same time,
   wherein the discharge controller comprises:
      a first logic circuit unit configured to receive the active mode signal and the bit line discharge enable signal, and output a low level signal when each of the active mode signal and the bit line discharge enable signal is at a high level;
      a second logic circuit unit configured to receive an active mode bar signal and the first signal, and output a low level signal when each of the active mode bar signal and the first signal is at a high level; and
      a third logic circuit unit configured to receive output signals of the first and second logic circuit units.

7. The semiconductor memory apparatus according to claim 6, wherein a pre-discharge period of the bit lines is decided by an enable period of the first signal.

8. The semiconductor memory apparatus according to claim 6, wherein the bit line discharge block comprises dummy switching elements electrically coupled to the bit lines and a bit line discharge signal line.

9. A semiconductor integrated circuit comprising:

a signal transmission line;

a discharge block coupled to the signal transmission line, and configured to discharge data of the signal transmission line in response to a discharge signal; and a control block coupled to the discharge block, and configured to provide the discharge signal which is enabled at regular discharge timing and pre-discharge timing before the regular discharge timing, respectively, wherein the regular discharge timing is decided when an active mode signal is enabled and the pre-discharge timing is decided when the active mode signal is disabled, wherein the pre-discharge timing is decided by a first signal having a predetermined enable period before the active mode signal, wherein the control block comprises:

a first logic circuit unit configured to receive the active mode signal and a discharge enable signal, and output a low level signal when each of the active mode signal and the discharge enable signal is at a high level;

a second logic circuit unit configured to receive an active mode bar signal and the first signal and output a low level signal when each of the active mode bar signal and the first signal is at a high level; and a third logic circuit unit configured to receive output signals of the first and second logic circuit units.

* * * * *